United States Patent [19]

Stahlhofen

[11] Patent Number: 4,889,789
[45] Date of Patent: Dec. 26, 1989

[54] PHOTOSENSITIVE COMPOSITION AND PHOTOSENSITIVE COPYING MATERIAL PREPARED THEREFROM WHEREIN COMPOSITION HAS A THERMAL CROSSLINKING URETHANE FORMALDEHYDE CONDENSATE

[75] Inventor: Paul Stahlhofen, Wiesbaden, Fed. Rep. of Germany

[73] Assignee: Hoechst Aktiengesellschaft, Frankfurt am Main, Fed. Rep. of Germany

[21] Appl. No.: 177,414

[22] Filed: Apr. 4, 1988

[30] Foreign Application Priority Data

Apr. 3, 1987 [DE] Fed. Rep. of Germany ....... 3711264

[51] Int. Cl.$^4$ .......................... G03C 1/60; G03C 1/495
[52] U.S. Cl. ..................................... 430/191; 430/165; 430/192; 430/270; 430/906
[58] Field of Search ............... 430/191, 192, 165, 270, 430/906, 920

[56] References Cited

U.S. PATENT DOCUMENTS

| 3,402,044 | 9/1968 | Steinhoff et al. | 430/192 |
| 4,063,949 | 12/1977 | Uhlig et al. | 430/300 |
| 4,104,070 | 8/1978 | Moritz et al. | 96/36 |
| 4,144,203 | 3/1979 | Hochne et al. | 525/105 |
| 4,196,003 | 4/1980 | Watanabe | 430/193 |
| 4,506,006 | 3/1985 | Ruckert | 430/325 |
| 4,576,901 | 3/1986 | Stahlhofen | 430/325 |
| 4,581,321 | 4/1986 | Stahlhofen | 430/325 |
| 4,699,867 | 10/1987 | Schneller et al. | 430/270 |

FOREIGN PATENT DOCUMENTS

| 565734 | 12/1987 | Australia | 430/192 |
| 164248 | 11/1985 | European Pat. Off. | 430/192 |
| 2082339 | 3/1982 | United Kingdom. | |

OTHER PUBLICATIONS

DeForest, W. S., *Photoresist Materials and Processes*, McGraw-Hill Book Co., 1975, pp. 47–59.

W. Lengsfled, Farben und Lacke ("Dyes and Varnishes") 75, Nr. 11, 1969, Uber die Struktur butylierter Aminoplaste, pp. 1053–1065.

Houben–Weyl, Methoden der Organischen Chemie ("Methods of Organic Chemistry") 14/2 pp. 350–351, 379 (1963).

*Primary Examiner*—Charles L. Bowers, Jr.
*Attorney, Agent, or Firm*—Foley & Lardner, Schwartz, Jeffery, Schwaab, Mack, Blumenthal & Evans

[57] ABSTRACT

A photosensitive composition which substantially comprises a binder which is insoluble in water and soluble in aqueous-alkaline solutions, a photosensitive 1,2-naphthoquinone-diazide or a photosensitive mixture comprised of a compound which splits off acid upon exposure to light and a compound containing at least one acid-cleavable C-O-C group, and a thermally crosslinking compound comprising a urea or urethane-formaldehyde condensation product is disclosed. Also disclosed is a copying material prepared from this composition. The material has a good shelf life and can be processed as a positive or negative-working material, and also according to the photocomposing method. For development customary developer solutions are used.

6 Claims, No Drawings

PHOTOSENSITIVE COMPOSITION AND PHOTOSENSITIVE COPYING MATERIAL PREPARED THEREFROM WHEREIN COMPOSITION HAS A THERMAL CROSSLINKING URETHANE FORMALDEHYDE CONDENSATE

BACKGROUND OF THE INVENTION

The present invention relates to a photosensitive composition substantially comprising a binder which is insoluble in water and soluble in aqueous alkaline solutions, a photosensitive 1,2-quinonediazide or a photosensitive mixture comprising a compound which splits off acid upon exposure to light and a compound containing at least one acid-cleavable C-O-C group, and a thermally crosslinking compound. The invention also relates to a copying material prepared from this composition.

Photosensitive compositions, the imagewise exposed areas of which become soluble in a developer solution and the unexposed areas of which remain insoluble, have been known for a long time. For the preparation of such materials, layers containing o-quinonediazides as photosensitive compounds and which additionally contain resins with groups providing alkaline solubility, for example phenolic resins, are primarily used in practice.

Photosensitive compositions based on acid-cleavable compounds are also known. They contain orthocarboxylic acid derivatives, monomeric or polymeric acetals, enol ethers or acylimino carbonates as the acid cleavable compounds. The radiation-sensitive compounds splitting off acid, which are contained in these compositions, predominantly comprise organic halogen compounds, in particular, s-triazines substituted by methyl halide groups. The binders used also comprise resins with groups providing alkaline solubility.

It is also known that a normally positive-working copying material based on o-quinonediazides can be used for negative processing in the presence of appropriate additives and by a particular sequence of treatments. British Patent Application No. 2 082 339 describes a reversal process of this kind, in which a photosensitive mixture comprising an o-quinonediazide and at least one resol can be employed as a negative-working recording material. German Offenlegungsschrift No. 25 29 054 (corresponding to U.S. Pat. No. 4,104,070) describes resist layers based on 1,2-quinonediazides for use in a reversal process. These layers contain a hydroxyalkylimidazoline as an additive. A similar material containing secondary or tertiary amines is disclosed in U.S. Pat. No. 4,196,003. European Patent Application No. 0 133 216 (corresponding to U.S. Pat. No. 4,581,321) describes a reversal process, in which the o-quinonediazide-containing copying layer contains an additive comprising a hexamethylolmelamine ether which is preferably used as a crosslinking agent in polymer reactions, while European Patent Application No. 0 131 238 (corresponding to U.S. Pat. No. 4,576,901) discloses a reversal process, in which the photosensitive material does not require any of the above-indicated basic or acidic additives.

There has also been disclosed a positive-negative reversal process based on acid-cleavable compounds instead of 1,2-quinonediazides, as described in European Patent Application No. 0 082 463 (corresponding to U.S. Pat. No. 4,506,006).

The above-mentioned reversal processes basically comprise the same sequence of processing steps, including heating the printing plate after imagewise exposure, re-exposing the cooled plate without an original and then developing by means of an aqueous-alkaline developer.

These reversal processes are based on the fact that the photo decomposition products produced form an insoluble reaction product when they are heated. This thermal hardening (crosslinking) preferably takes place in the presence of particular basic or acidic additives in the copying layer or in the presence of particular crosslinking agents containing multifunctional reactive groups.

Additives of this kind, however, usually have an adverse influence on the shelf life of the copying layers and on particular properties relating to copying technique, for example, photosensitivity and image contrast after exposure. In addition, for many applications the temperature required for image reversal is too high, or the duration of heating at a relatively low temperature is too long, or the temperature range, in which the reversal treatment can be carried out is too narrow.

In the reversal process described in European Patent Application No. 0 133 216, the copying layer contains, in addition to a 1,2-quinonediazide, an ether of hexamethylolmelamine as an essential constituent, as mentioned above. Although such melamine ethers advantageously promote the image reversal of a normally positive-working photosensitive material during thermal hardening in the exposed image areas, the hexamethylolmelamine ethers nevertheless have the disadvantage that the temperature tolerances of the reversal range are relatively narrow, which may give rise to varying copying results. It is also a significant disadvantage that, owing to the reactive groups of the hexamethylolmelamine ethers, the printing plates have a poor shelf life, in particular at elevated temperatures, which leads to premature crosslinking and thus renders the printing forms useless.

SUMMARY OF THE INVENTION

It is an object of the present invention to provide a photosensitive composition and a copying material prepared therefrom, for use in the production of negative copies by means of a normally positive-working photosensitive copying material based on, for example, 1,2-quinonediazides, which copying material does not have the above-indicated disadvantages, and which, in particular, does not impair the good shelf life of the printing plates produced, even at elevated temperatures, and which moreover possesses a relatively large reversal range.

These and other objects of the invention are achieved by a photosensitive composition comprising a binder which is insoluble in water and soluble in aqueous-alkaline solutions, a photosensitive 1,2-quinonediazide or a photosensitive mixture comprised of a compound which splits off acid upon exposure to light and a compound containing at least one acid cleavable C-O-C group, and a thermally crosslinking compound.

DESCRIPTION OF THE PREFERRED EMBODIMENT

In compositions according to the invention the thermally crosslinking compound used comprises a urea or urethane-formaldehyde condensation product. Preference is given to condensation products according to the general formula I

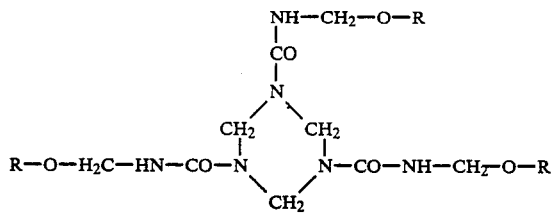

or to condensation products according to the general formula II

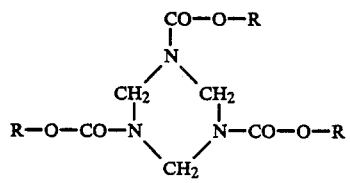

in which formulae R represents hydrogen or an alkyl group.

Compounds such as non-plastified urea-formaldehyde resin or butylurethane-formaldehyde resin have proved particularly advantageous.

According to W. Lengsfeld, *Farben und Lacke* ("Dyes and Varnishes") 75, 1969, page 1063, the urea resin according to the invention predominantly has a cyclic hexahydrotriazine structure built up of three urea base molecules, corresponding to the general formula I.

The urethane resin (carbamic-acid-ester resin) which can be used according to the present invention corresponds to formula II and is substantially also present in the form of a hexahydrotriazine derivative.

The esterified urea resins are usually prepared in a two-step process. The reaction mixture is precondensed under weakly alkaline conditions, then adjusted to a pH in the acidic region and completely condensed in the presence of the corresponding alcohol, with water being continuously removed by azeotropic distillation. Examples of the syntheses of urea-formaldehyde resins etherified with butanol or isobutanol are given in Houben-Weyl, *Methoden der organischen Chemie* ("Methods of Organic Chemistry") 14/2, pages 350/351, Examples 10, 11 and 14. The urethane resins are prepared by condensation of carbamic acid esters with formaldehyde in an acidic medium. An example of synthesis is given in Houben-Weyl, *Methods of Organic Chemistry*, 14/2, page 379, Example 10.

The photosensitive composition according to the present invention contains the condensation product in a quantity of from about 0.1% to 5.0% by weight, preferably of from about 0.5% to 3.0% by weight, based on the weight of its non-volatile constituents.

Compared with reversal processes for the production of negative copies by means of a normally positive-working photosensitive material based on, for example, 1,2-quinonediazides, the material of the present invention has the essential advantage that, in the presence of the formaldehyde condensation products used according to the present invention, the temperature tolerances of the actual reversal range are relatively large, such that tonal rendering is not adversely influenced, even in the case of considerable temperature variations during the reversal step.

Sensitizers which are suitable for use in the present invention comprise any 1,2-quinonediazide-sulfonic-acid esters, in particular, any 1,2-quinonediazide-sulfonic-acid-4-esters; 1,2-quinonediazide-sulfonic-acid-4-amides; or 1,2-quinonediazide-carboxylic-acid-4-esters and amides, which are rendered soluble in aqueous-alkaline solutions by exposure to actinic radiation.

Suitable esters of the 1,2-quinonediazide derivatives include the well-known reaction products of the acids or their halides with phenols, for example, with 2,3,4-trihydroxy-benzophenone, 2,4-dihydroxy-benzophenone, 4-decanoyl-resorcinol, 4-(2-phenylprop-2-yl)phenol, gallic acid octylester, or 4,4-bis-(4-hydroxyphenyl)-valeric acid butylester. The amides can be derived in a known manner from longer-chain aliphatic amines or, preferably, from aromatic amines.

The quantity of o-quinonediazide compounds generally ranges from about 3% to 50% by weight, preferably from about 7% to 35% by weight, based on the weight of the non-volatile constituents of the composition.

The photosensitive composition preferably also contains a polymeric, water-insoluble resinous binder, which dissolves in the solvents used for the composition of the invention and is soluble or at least swellable in aqueous alkalis.

The novolac condensation resins which are widely used in many positive copying materials based on naphthoquinonediazides have also proved advantageous for use as binders in the present invention. The novolacs can also be modified in a known manner, by reacting part of their hydroxy groups with, for example, chloroacetic acid, isocyanates, epoxides, or carboxylic acid anhydrides. Further preferred binders which are soluble or swellable in alkali include polyhydroxyphenol resins prepared by condensation of phenols with aldehydes or ketones, copolymers of styrene and maleic anhydride, polyvinylphenols, or copolymers of acrylic acid or methacrylic acid, in particular with acrylic or methacrylic acid phenolesters. The type and quantity of the alkali-soluble resin used may vary depending on the intended application; preference is given to quantities ranging between about 90% and 30% by weight, in particular between about 85% and 55% by weight, based on the solid substance.

A great number of other resins can additionally be employed, preferably epoxy resins and vinyl polymers, such as polyvinylpyrrolidones, and the copolymers of the monomers on which these resins are based and also hydrogenated or partially hydrogenated colophony derivatives.

The most favorable proportion of these resins depends on application related requirements and on their influence on development conditions and generally does not exceed about 50% by weight, and is preferably from about 2% to 35% by weight, of the alkali-soluble resin. To meet special requirements, such as flexibility, adhesion, gloss and coloration, the photosensitive composition can also contain substances, such as polyglycols, cellulose derivatives, e.g., ethyl cellulose, wetting agents, dyes, adhesion promoters and finely divided pigments and, if required, UV absorbers.

To effect color change after exposure, the photosensitive composition can also be admixed with small amounts of radiation-sensitive components which preferably form or split off strong acids upon exposure and cause a color change in a subsequent reaction with a suitable dye. Such radiation-sensitive components include, for example, 1,2-naphthoquinone-diazide-4-sulfonic acid chloride, bis- or trishalogenomethyl-striazines containing chromophoric substituents or diazonium compounds in the form of their salts with complex acids, such as tetrafluoroboric acid or hexafluorophosphoric acid.

The invention also provides a photosensitive copying material comprising a layer support and a photosensitive layer substantially comprising a binder which is insoluble in water and soluble in aqueous-alkaline solvents, a photosensitive 1,2-quinonediazide or a photosensitive mixture comprising a compound which splits off acid upon exposure to light and a compound containing at least one acid-cleavable C-O-C group, and a thermally crosslinking compound. The copying material is characterized in that the thermally crosslinking compound used comprises a urea or urethane-formaldehyde condensation product.

For coating a suitable layer support, the compositions are usually dissolved in a solvent. The selection of solvents depends on the intended coating process, the layer thickness and the drying conditions. Suitable solvents for the composition of the invention include ketones, such as methyl ethyl ketone; chlorinated hydrocarbons, such as trichloroethylene and 1,1,1-trichloroethane; alcohols, such as n-propanol; ethers, such as tetrahydrofuran; alcohol ethers, such as an ethylene or propylene glycol monoalkyl ether; and esters, such as butyl acetate. It is also possible to use mixtures which, for special purposes, may additionally contain solvents, such as acetonitrile, dioxane or dimethyl formamide. In principle any solvents can be used which do not irreversibly react with the layer components. Partial ethers of glycols, in particular ethylene glycol monomethyl ether and propylene glycol methyl ether are particularly preferred.

In most cases, the supports used for layer thicknesses of less than about 10 μm are metals. The following can be used for offset printing plates: millfinished, mechanically or electrochemically grained and optionally anodically oxidized aluminum, which additionally may have been chemically pretreated, for example, with polyvinylphosphonic acid, silicates, phosphates, hexafluorozirconates or with hydrolyzed tetraethyl orthosilicate.

Coating of the layer support is carried out in a known manner by means of spin-coating, spraying, dipping, roller-coating, application with slot dies, blade-spreading or flow-coater application.

Aqueous-alkaline solutions having a graduated alkalinity are used for developing; the solutions preferably have a pH in the range from about 10 to 14 and they can also contain minor amounts of organic solvents or surfactants.

For the reversal treatment, the imagewise irradiated or exposed copying material is heated without any further intermediate treatment. Heating can be effected by irradiation, convection, contact with heated surfaces, for example, rolls, or by immersion in a heated bath comprising an inert liquid, for example, water. The temperature can range between about 80° and 150° C., preferably between about 100° and 130° C. These temperatures are tolerated by the compositions of the present invention without any significant change in the properties of the unexposed areas, for example, the covered areas. The duration of heating can vary widely, depending on the method chosen for the application of heat. If a heat transferring medium is used, the heating time ranges between about 10 seconds and 10 minutes, in particular between about 1 and 3 minutes.

Following heating and cooling, the printing plate is subjected to overall exposure, in order to completely convert the still photosensitive layer areas into their photo decomposition products. For re-exposure, the light source used in the imagewise exposure can advantageously be used again.

Re-exposure is followed by developing with customary developers. In the process, the layer areas which were not struck by light in the original imagewise exposure are washed off. Suitable developers preferably comprise aqueous solutions of alkaline substances having a graduated alkalinity, for example, of alkali-metal phosphates, silicates, carbonates, or hydroxides, which can additionally contain surfactants or minor amounts of organic solvents. In particular cases, suitable developers also comprise organic solvents or mixtures of organic solvents with water. The material can be developed either immediately after heating and cooling, or after a time interval of, for example, several hours, without any attack occurring in the hardened layer areas.

The copying layers claimed in the present invention can be used for the production of a negative copy from the normally positive-working copying layer and they can moreover advantageously be used to materialize various possibilities of combining line and screen films by exposing them together on the same plate (photocomposing). Immediately after the first imagewise exposure under a negative original, for example, the layer areas not yet struck by light, i.e., which were covered by a mask during the first exposure, can be subsequently exposed under a further line or screen image, with the aid of a positive original. The printing plate exposed in this manner is then developed without any further intermediate steps. A final printing form is obtained which, depending on the masking, could be provided with additional information by exposing under a positive or negative original.

The copying layers of the present invention have the advantage of combining good shelf life, even at elevated temperatures, with relatively quick hardening of the imagewise exposed layer areas, under the action of heat.

Above all, it is an advantage that, in the presence of the formaldehyde condensation products employed according to the invention in the copying layer, the temperature tolerances of the reversal range are relatively large and, as a result, tonal rendering is not adversely influenced, even in the case of considerable temperature variations during the reversal step.

Additional treatment steps in which liquids are used, or a special composition of the photosensitive material are not required. The only additional treatment step, i.e., heating, can usually easily be carried out with the aid of existing drying apparatus. The last exposure without an original is most simply performed with the light source used for imagewise exposure.

The copying material of the present invention can, for example, be used in the production of printing forms for letterpress, gravure and planographic printing, in the production of photoresist stencils for the subtractive and additive preparation of printed circuit boards, in the production of nickel screen-printing cylinders prepared by an electroplating process, and in the production of masks in microelectronics, according to the lift-off technique.

In the examples which follow, preferred embodiments of the present invention are described. Percentages and quantitative ratios are to be understood as units of weight, unless otherwise specified.

EXAMPLE 1

An electrochemically grained and anodically oxidized aluminum sheet was coated with a solution of

| 1.40 | parts by weight | of the esterification product of 1 mole of 4-(2-phenylprop-2-yl)-phenol and 1 mole of 1,2-naphtho-quinone-2-diazide-4-sulfonic acid chloride, |
|---|---|---|
| 7.60 | parts by weight | of a cresol-formaldehyde novolac having a softening range from 127° to 145° C., |
| 0.10 | part by weight | of a non-plastified formaldehyde-urea resin (®Resamin HF 227 manufacturers HOECHST AG), |
| 0.08 | part by weight | of 2,4-bis-trichloromethyl-6-p-stilbenyl-s-triazine, |
| 0.08 | part by weight | of Crystal Violet, Color Index (C.I.) 42,555, |
| 55.00 | parts by weight | of ethylene glycol monomethyl ether, and |
| 70.00 | parts by weight | of tetrahydrofuran. |

Before applying the photosensitive copying layer the anodically oxidized aluminum support had been treated with an aqueous solution containing 0.1% by weight of polyvinyl phosphonic acid.

The presensitized material prepared in this manner, in which the photosensitive layer had a layer weight of about 2.3 g/m² was exposed imagewise under a transparent positive original for a duration of 60 exposure units, with the aid of a 500 watt metal halide lamp arranged at a distance of 103 cm and was then developed with a 5% strength aqueous solution of sodium silicate. In the developing procedure, the portions of the copying layer which had been struck by light were removed and the unexposed image areas remained on the layer support, such that a printing stencil corresponding to the original was obtained. Inking with a greasy printing ink yielded a positive printing form which was ready for printing.

Another sample of the same presensitized material was processed to give a negative printing plate. For this purpose, the sample was exposed under a negative original for a duration of 60 exposure units, thereafter heated for 2 minutes at 120° C. and then re-exposed for 30 exposure units without an original. Upon developing in the same developer for the same period of time as used above, a reversed image of the original was obtained.

It is also possible to process the material according to the photocomposing method, i.e., by the subsequent exposure under line or screen originals onto a printing plate which has already been exposed imagewise. For this purpose the presensitized material prepared is first exposed imagewise under a negative original, thereafter heated for 2 minutes at 120° C., and then again exposed under a diapositive, in the layer areas not yet struck by light. The printing plate repeatedly exposed in this manner is developed without any further intermediate steps and, as a result, the final printing form is obtained.

As compared with the hitherto known reversal plates and processes, the present invention offers the great advantage of a relatively large treatment range during the heat-treatment step. This becomes apparent when the normally positive-working photosensitive printing plate prepared is exposed imagewise under a negative original, in the presence of a test wedge as customarily used in the imagewise exposure of offset printing plates, for example, the UGRA-Offset-Test Wedge 1982, and is thereafter subjected to the heating step required for image reversal. When the imagewise exposed printing plate is, for example, heat-treated for 2 minutes, the temperature can be varied between about 115° and 140° C., without giving rise to any visible change in the test image resulting after the subsequent overall re-exposure and development. This is, in particular, observed in the reproduction of the continuous-tone step wedge which is very sensitive to any chemical or physical change in the copying layer. The large temperature tolerance of the actual reversal step during processing is very desirable in practice, since properties relating to copying technique, such as the tonal rendering, are not adversely influenced, even in the case of relatively wide temperature variations, which may occur in the heating ovens or automatic converting apparatus used in practice.

If the methyl-etherified formaldehyde condensation product used according to the present invention is, for example, replaced by the same quantity of hexamethylol melamine hexamethyl ether according to European Patent Application No. 0 133 216 and after imagewise exposure under the same test original, the heat-treatment step is likewise carried out for 2 minutes, the resulting temperature range is only about 15° C.

In the following examples further coating solutions are specified, which yield results similar to those indicated in Example 1. Unless specifically mentioned, preparation and processing of the printing plates obtained with these coating solutions are carried out under the conditions described in Example 1. The exposed printing plates are developed, in each case, with a 5% strength aqueous of sodium metasilicate.

EXAMPLE 2

The coating solution comprises:

| 1.40 | parts by weight | of the esterification product of 1 mole of 2,3,4-trihydroxy-benzophenone and 3 moles of 1,2-naphthoquinone-2-diazide-4-sulfonic acid chloride, |
|---|---|---|
| 7.60 | parts by weight | of the novolac specified in Example 1, |
| 0.14 | part by weight | of a carbamic acid ester resin obtained from butyl urethane and formaldehyde (®Uresin B, manufacturers HOECHST AG), |
| 0.08 | part by weight | of 2,4-bis-trichloromethyl-6-p-methoxystyryl-s-triazine, |
| 0.08 | part by weight | of Crystal Violet, |
| 55.00 | parts by weight | of ethylene glycol monomethyl ether, and |
| 70.00 | parts by weight | of tetrahydrofuran. |

EXAMPLE 3

The coating solution comprises:

| 1.40 | parts by weight | of the esterification product of 1 mole of 4-(2-phenylprop-2-yl)-phenol and 1 mole of 1,2-naphthoquinone-2-diazide-4-sulfonic acid chloride, |
|---|---|---|
| 7.60 | parts by weight | of the novolac specified in Example 1, |
| 0.20 | part by weight | of a non-plastified formaldehyde-urea resin (®Resamin HF 180, manufacturers HOECHST AG), |
| 0.08 | part by weight | of 2,4-bis-trichloromethyl-6-p- |

-continued

| | | |
|---|---|---|
| | | stilbenyl-s-triazine, |
| 0.08 | part by weight | of Crystal Violet, |
| 55.00 | parts by weight | of ethylene glycol monomethyl ether, and |
| 70.00 | parts by weight | of tetrahydrofuran. |

EXAMPLE 4

An electrolytically grained and anodically oxidized aluminum sheet was coated with a solution of:

| | | |
|---|---|---|
| 1.40 | parts by weight | of a polyorthoester prepared from 7,7-bis-hydroxymethyl-5-oxa-nonanol-(1) and trimethyl orthoformate, |
| 0.22 | part by weight | of 2,4-bis-trichloromethyl-6-p-stilbenyl-s-triazine, |
| 0.18 | part by weight | of a resin according to Example 1, |
| 4.70 | parts by weight | of the novolac specified in Example 1, |
| 0.04 | part by weight | of Crystal Violet base, in |
| 35.00 | parts by weight | of ethylene glycol monomethyl ether, and |
| 45.00 | parts by weight | of tetrahydrofuran. |

The presensitized copying material thus prepared, in which the photosensitive layer had a layer weight of about 2.0 g/m$^2$, was exposed imagewise under a transparent positive original for a duration of 10 exposure units with the aid of a 500 watt metal halide lamp arranged at a distance of 103 cm and was then developed with a 4% strength aqueous solution of sodium silicate. In the developing procedure the portions of the copying layer which had been struck by light were removed and the unexposed image areas remained on the layer support, such that a printing stencil corresponding to the original was obtained. Inking with a greasy printing ink yielded a positive printing form which was ready for printing.

Another sample of the same presensitized material was processed to give a negative printing plate. For this purpose, the sample was exposed under a negative original for a duration of 10 exposure units, thereafter heated for 2 minutes at 130° C. and then re-exposed for 10 exposure units without an original. Upon developing in the same developer for the same period of time as used above, a reversed image of the original was obtained.

What is claimed is:

1. A photosensitive composition comprising in admixture:
    a polymeric binder which is insoluble in water and soluble in aqueous-alkaline solutions present in an amount sufficient to form a uniform film;
    a photosensitive 1,2-quinonediazide or a photosensitive mixture comprising a compound which splits off acid upon exposure to light and a compound containing at least one acid-cleavable C-O-C group; and
    a thermally crosslinking compound, wherein the thermally crosslinking compound comprises a condensation product according to the general formula

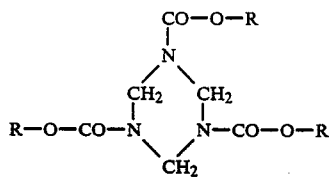

wherein R represents hydrogen or an alkyl group and wherein the photosensitive compound or mixture is present in an amount sufficient to render exposed soluble in developer and the condensation product is present in an amount sufficient to cause hardening of exposes areas under the action of heat.

2. A composition as claimed in claim 1, wherein the thermally crosslinking compound used comprises a butylurethane-formaldehyde resin.

3. A composition as claimed in claim 1, wherein the thermally crosslinking compound is present in a quantity of 0.1% to 5% by weight, based on the weight of the non-volatile constituents of the composition.

4. A photosensitive copying material comprising:
    a layer support;
    a photosensitive layer comprising a polymeric binder which is insoluble in water and soluble in aqueous-alkaline solutions present in an amount sufficient to form a uniform film, a photosensitive 1,2-quinonediazide or a photosensitive mixture comprising a compound which splits off acid upon exposure to light and a compound containing at least one acid-cleavable C-O-C group, and a thermally crosslinking compound, wherein the thermally crosslinking compound comprises a condensation product according to the general formula

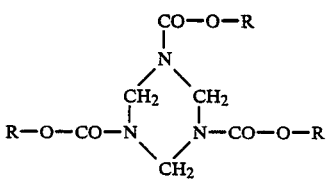

wherein R represents hydrogen or an alkyl group and wherein the photosensitive compound or mixture is present in an amount sufficient to render exposed soluble in developer and the condensation product is present in an amount sufficient to cause hardening of exposed areas under the action of heat.

5. A photosensitive composition according to claim 1, consisting essentially of the recited components.

6. A composition as claimed in claim 2, wherein the thermally crosslinking compound is present in a quantity of 0.1% to 5% by weight, based on the weight of the non-volatile constituents of the composition.

* * * * *